United States Patent
Manteghi (12)

(10) Patent No.: US 6,228,683 B1
(45) Date of Patent: May 8, 2001

(54) HIGH DENSITY LEADED BALL-GRID ARRAY PACKAGE

(75) Inventor: Kamran Manteghi, Manteca, CA (US)

(73) Assignee: Philips Electronics North America Corp, New York, NY (US)

( * ) Notice: Subject to any disclaimer, the term of this patent is extended or adjusted under 35 U.S.C. 154(b) by 0 days.

(21) Appl. No.: 09/158,685

(22) Filed: Sep. 22, 1998

Related U.S. Application Data

(63) Continuation of application No. 08/710,602, filed on Sep. 20, 1996, now Pat. No. 5,854,512.

(51) Int. Cl.[7] .................. H01L 21/44; H01L 21/48; H01L 21/50; H01L 23/495
(52) U.S. Cl. .................. 438/112; 438/617; 257/666; 257/668
(58) Field of Search .................... 438/112, 617; 257/666, 668, 780, 784, 787, 735, 738

(56) References Cited

U.S. PATENT DOCUMENTS

| | | | |
|---|---|---|---|
| 5,442,230 | * | 8/1995 | Chillara .................. 257/666 |
| 5,646,831 | * | 7/1997 | Manteghi .................. 361/813 |
| 5,672,548 | * | 9/1997 | Culnane .................. 438/118 |
| 5,689,091 | * | 11/1997 | Hamzehdoost .................. 174/255 |
| 5,705,851 | * | 1/1998 | Mostafazadeh .................. 257/675 |
| 5,729,051 | * | 3/1998 | Nakamura .................. 257/668 |

OTHER PUBLICATIONS

"Electronic Packaging, Microelectronics, and Interconnection Dictionary," Charles A. Harper et al., McGraw–Hill, pp. 70, 126–27, 169, 181, 1993.*

"Soldering in Electronics Assembly," Mike Judd, et al., Newnes, pp. 51–53, 1999.*

* cited by examiner

*Primary Examiner*—Charles Bowers
*Assistant Examiner*—Nema Berezny
(74) *Attorney, Agent, or Firm*—Patrick T. King

(57) ABSTRACT

A high density leaded ball-grid array package for packaging an integrated-circuit die includes a laminated substrate formed of a non-conductive layer sandwiched between first and second conductive trace patterns. A leadframe is directly attached onto the first conductive trace pattern of the laminated substrate by a non-conductive adhesive so that the open portion thereof overlies a central region of the laminated substrate. An integrated-circuit die is mounted in the central region of the laminated substrate. Bonding wires are interconnected between bonding pads formed on the integrated-circuit die and bonding fingers formed on the leadframe. A plastic material is molded over the top surface of the die, bonding fingers and bonding wires. A solder mask is applied on the second conductive trace pattern so as to form selective solderable areas. Finally, solder balls are attached to the selective solderable areas.

11 Claims, 2 Drawing Sheets

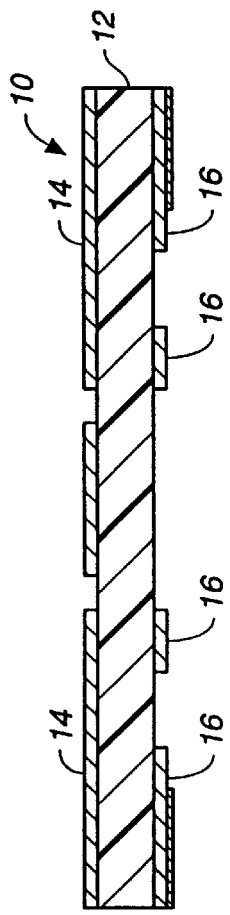
FIG._1A
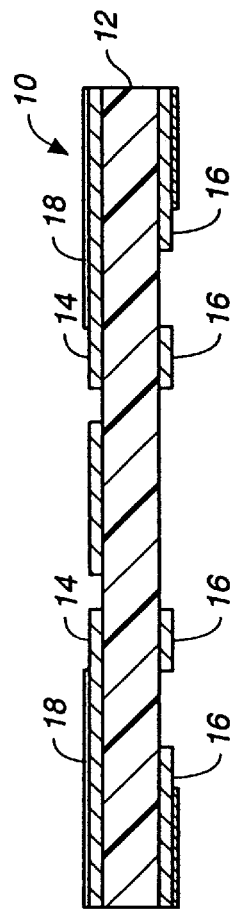
FIG._1B
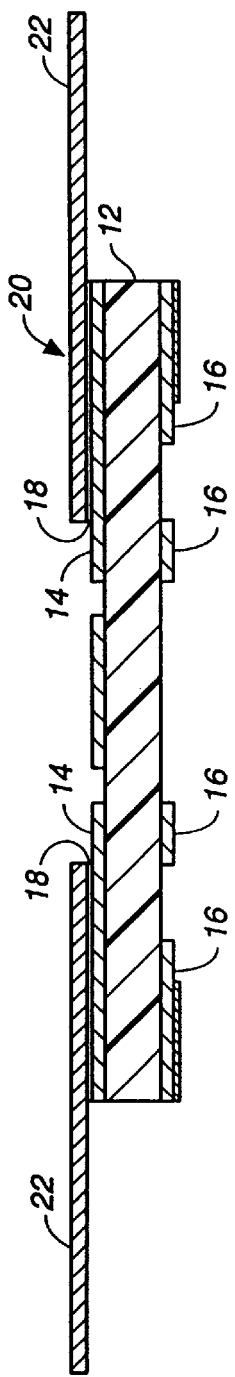
FIG._1C
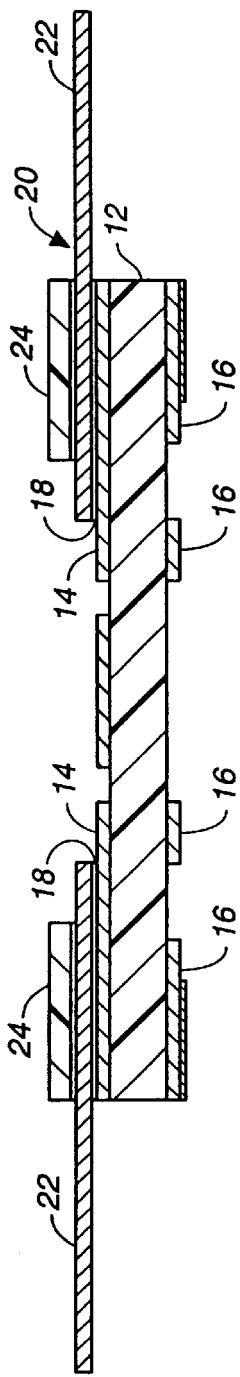
FIG._1D

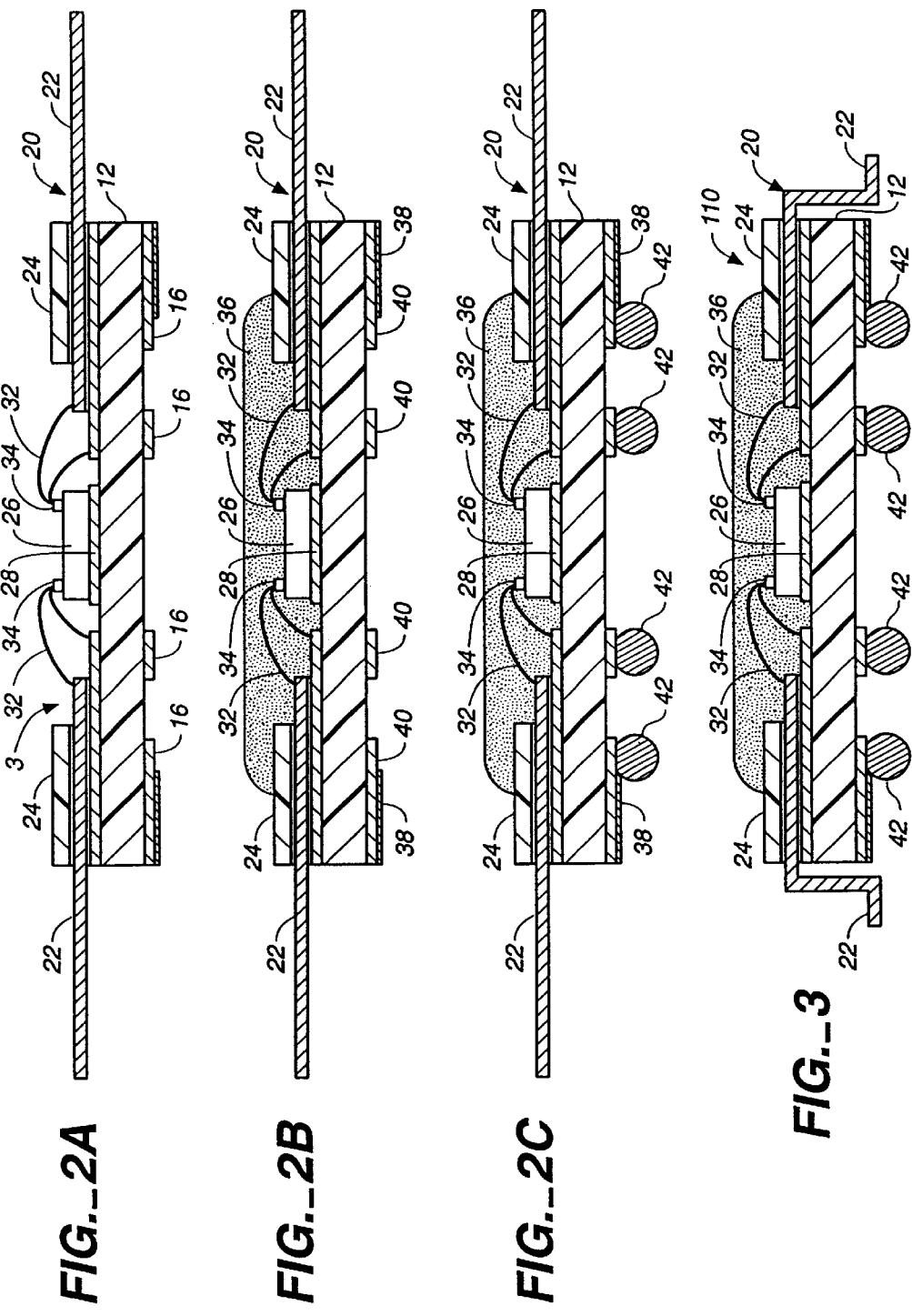

HIGH DENSITY LEADED BALL-GRID ARRAY PACKAGE

This is a continuation of application Ser. No. 08/710,602, filed Sep. 20, 1996, now U.S. Pat. No. 5,854,512.

BACKGROUND OF THE INVENTION

This invention relates generally to semiconductor integrated circuit packages and more particularly, it relates to an improved high density leaded ball-grid array (BGA) package of a simple construction which includes a leadframe mounted on a top side of a laminated substrate and solder balls attached to the bottom side thereof so as to accommodate a higher lead-count.

In recent years, there has existed a high level of interest in the area of ball grid array (BGA) package and assembly technology. The reason for this is because the package and interconnection industry has departed from the use of pins as connectors for electronic packaging due to their high cost of fabrication, the high failure rate of connections, and the limitations on the density of input/output pins. As a result, solder balls have been used which are superior to pins in the above areas as well as being surface mountable.

As is generally known heretofore, ball-grid array (BGA) semiconductor packages typically include a substrate such as a printed circuit board and a semiconductor chip or die mounted on the top side of the substrate. A conductive trace pattern is also formed on the top side of the printed circuit board. The die generally contains a number of electrical circuits therein and includes a plurality of bonding pads disposed on its top surface adjacent its peripheral edges. Very thin gold bonding-wires have their one ends bonded to the corresponding pads on the integrated-circuit die and their other ends bonded to the corresponding ends of the conductive trace pattern on the top side of the printed circuit board. A second conductor trace pattern is formed on the bottom side of the printed circuit board and is electrically connected to the first conductive trace pattern on the top side thereof through respective plated-through holes. Each of the ends in the second conductive trace pattern terminates with a contact pad where a conductive solder ball is attached thereto. Generally, the semiconductor die and the bonding-wires are encapsulated in an encapsulating material such as a plastic molding compound.

The consumers of the BGA packages in the electronic and computer industries have been demanding higher and higher die densities to support higher lead counts within the same package footprint area. Further, the consumers are likewise demanding improved conductor routing to the package so as to produce enhanced electrical performance and to reduce costs. While some package designers have attempted to solve these problems by utilizing multi-layer substrates, this use of increased number of substrates is generally more expensive and has thus increased manufacturing costs.

Accordingly, there exists a need for an improved high density leaded BGA package which can accommodate the electronic and computer industry's demand for a smaller pitch distance between the conductor solder balls in order to provide higher lead counts within the same conventional package size. It would also be expedient to provide an improved high density leaded BGA package which is of a simple construction and is relatively low in cost to manufacture and assemble, but yet still has a high electrical performance.

SUMMARY OF THE INVENTION

Accordingly, it is a general object of the present invention to provide an improved high density leaded BGA packages which is relatively simple in its construction and is easy to manufacture and assemble.

It is an object of the present invention to provide an improved high density leaded BGA package which can accommodate higher lead counts within the same conventional package size.

It is another object of the present invention to provide an improved high density leaded BGA package which has a high electrical performance.

It is still another object of the present invention to provide a high density leaded BGA package which includes a leadframe mounted on the top side of a laminated substrate and solder balls attached to the bottom side thereof so as to accommodate a higher lead count.

It is yet still another object of the present invention to provide a method for fabricating an improved high density leaded BGA package of a simple design, thereby reducing manufacturing costs.

In accordance with these aims and objectives, the present invention is concerned with the provision of a high density leaded ball-grid array package for packaging an integrated-circuit die which includes a non-conductive layer having top and bottom sides. A first conductive trace pattern is laminated on the top side of the non-conductive layer. A second conductive trace pattern is laminated on the bottom side of the non-conductive layer. The non-conductive layer is sandwiched between the first and second conductive trace patterns so as to form a laminated substrate. A leadframe is provided which has a plurality of conductive leads and a centrally-located open portion. The plurality of conductive leads have their innermost ends defining bonding fingers. The leadframe is directly attached onto the first conductive trace pattern of the laminated substrate by a non-conductive adhesive so that the open portion thereof overlies a central region of the laminated substrate.

An integrated-circuit die is mounted in the central region of the laminated substrate. The bonding fingers are disposed peripherally surrounding the integrated-circuit die. Bonding wires are interconnected between bonding pads formed on the integrated-circuit die and the bonding fingers on the leadframe. A plastic material is molded over the top surface of the die, bonding fingers and bonding wires. A solder mask is disposed over the second conductive trace pattern so as to form selective solderable areas. Solder balls are attached to the selective solderable areas.

BRIEF DESCRIPTION OF THE DRAWINGS

The accompanying drawings, which are incorporated in and form a part of this specification, illustrate embodiments of the invention and, together with the description, serve to explain the principles of the invention:

FIGS. 1(a) through 1(d) show the beginning steps for producing an improved BGA package of FIG. 3, constructed in accordance with the principles of the present invention;

FIGS. 2(a) through 2(c) show the subsequent steps for producing the improved BGA package of FIG. 3; and FIG. 3 depicts a cross-sectional view of the improved BGA package produced in accordance with the teachings of the present invention.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

FIGS. 1(a)–1(d) illustrate the initial steps for producing an improved high density leaded BGA package 110 of FIG. 3 of the present invention. FIGS. 2(a) through 2(c) show the subsequent steps for producing the improved high density leaded BGA package 110. FIG. 3 is a cross-sectional view of the improved high density leaded BGA package 110 produced in accordance with the steps taught in FIGS. 1 and 2.

With particular reference to FIGS. 1(a)–1(d), there is shown a laminated substrate 10 which includes a dielectric layer 12. The dielectric layer 12 serves as a printed circuit board and is formed of a non-conductive material such as FR-4 glass-epoxy, polyimide, or other suitable material. The non-conductive material 12 is preferably formed of a layer of glass-epoxy material. The top side of the glass-epoxy layer 12 is laminated with a first conductive trace pattern 14. Similarly, the bottom side of the glass-epoxy layer 12 is laminated with a second conductive trace pattern 16. The first and second conductive trace patterns 14 and 16 are preferably formed of copper or other similar highly conductive material. This is depicted in FIG. 1(a) as a copper laminated substrate 10.

Next, a layer of non-conductive adhesive such as epoxy 18 is applied on the top surface of the laminated substrate 10 as is desired which is shown in FIG. 1(b). Then, a high lead-count leadframe 20 having a plurality of conductive leads 22 is directly attached onto the epoxy layer 18. This is shown in FIG. 1(c). The epoxy material is typically applied in liquid form atop the conductive traces 14 and is subsequently cured. The leadframe 20 is typically stamped or chemically etched from a leadframe material. The types of suitable leadframe material includes copper, iron, nickel, aluminum, or alloys containing these metals. Further, the conductive leads 22 may be plated with a highly conductive material such as silver, copper, gold or palladium. As illustrated in FIG. 1(d), an optional second non-circuitized substrate such as a printed circuit board 24 may be laminated atop the leadframe 20.

Now with reference to FIGS. 2(a) through 2(c), a semiconductor integrated-circuit chip or die 26 is mounted to a die-attach pad 28 on the top surface of the glass-epoxy layer 12. The die 26 is attached to the die-attach pad 28 via an epoxy such as Ablestik 84-ILMI which is commercially available from Ablestik Inc. The open portion 30 of the leadframe overlies a central region of the laminated substrate 10. The innermost ends of the respective conductive leads 22 are called bonding fingers. Very thin gold wires 32 are bonded between corresponding ones of bonding pads 34 formed on the top surface of the die 26 and corresponding ones of the bonding fingers on the leadframe 20 and first conductive trace pattern 14. This is depicted in FIG. 2(a).

After mounting of the die 26 and the wire bonding process, the laminated substrate, leadframe, and die subassembly is placed in a mold cavity and is hermetically sealed or encapsulated with a plastic molding compound 36. This is shown in FIG. 2(b). The molding compound flows over the top surface of the die 26, the bonding fingers and bonding wires and fills the open portion 30 so as to form a glob top. Alternatively, a lid (not shown) may be affixed in a suitable manner in lieu of the encapsulation so as to provide mechanical protection. The molding compound, for example, be a standard molding compound such as provided by the Ablestik Company as 6300 HS or HG molding compound or as 7320C low viscosity molding compound.

After the encapsulation process, a solder mask 38 is applied, preferably using a screen printing procedure known in the art. During such procedure, the entire exposed surfaces of the second conductive trace pattern 16 is covered with a compatible material, except for selective solderable areas 40, where it is desired to have the solder balls applied, and is subsequently cured. This step is shown in FIG. 2(b).

Thereafter, a plurality of solder balls 42 are attached to the selective solderable areas 40. The solder balls are formed of eutectic solder material, preferably 63% Sn and 37% Pb so as to reflow for joining the solder balls to the next-level board (i.e., motherboard). One conventional technique suitable for mounting the solder balls 42 to the selective solderable areas 40 is the so-called C-4 (controlled collapse chip connection) technology.

Finally, the outer ends of the conductive leads 22 of the leadframe 20 are then trimmed and formed to the desired shape or configuration and dimension in order to form the completed high density leaded BGA package 110 shown in FIG. 3. The completed BGA package 110 can then be subsequently mounted to a next-level board (i.e., printed circuit board). The completed BGA package 110 is illustrated in FIG. 3.

From the foregoing detailed description, it can thus be seen that the present invention provides an improved high density leaded ball-grid array package for packaging an integrated-circuit die which can accommodate a higher lead-count. The BGA package of the present invention includes a laminated substrate having a central region and a high lead-count leadframe having a plurality of conductive leads and a centrally-located open portion. The leadframe is directly attached onto a first conductive trace pattern of the laminated substrate by a non-conductive adhesive so that the open portion thereof overlies the central region of the laminated substrate. After the die attach and wire bonding process, a plastic material is molded over the top surface of the die, bonding fingers and bonding wires. Thereafter, a solder mask is applied on a second conductive trace pattern so as to form selective solderable areas. Finally, solder balls are attached to the selective solderable areas.

What is claimed is:

1. A method for fabricating a high density leaded ball-grid array package for an integrated-circuit die comprising the steps of:

laminating top and bottom sides of a non-conductive layer with respective first and second conductive trace patterns so as to form a laminated substrate;

directly attaching a leadframe, which has a plurality of conductor leads and a centrally-located open portion, onto the first conductive trace pattern of the laminated substrate by a non-conductive adhesive so that the open portion of the leadframe overlies a central region of the laminated substrate;

mounting an integrated-circuit die in the central region of the laminated substrate;

interconnecting bonding wires between bonding pads on the integrated-circuit die and bonding fingers formed on the lead frame;

molding a plastic material over the top surface of the die, bonding fingers and bonding wires;

applying a solder mask on the second conductive trace pattern so as to form selectively solderable areas for attachment of solder balls; and attaching solder balls to the selectively solderable areas.

2. A method for fabricating high density leaded ball-grid array package as claimed in claim 1, wherein said leadframe is stamped from a sheet of leadframe material.

3. A method for fabricating high density leaded ball-grid array package as claimed in claim 1, wherein said leadframe is chemically etched from a sheet of leadframe material.

4. A method for fabricating high density leaded ball-grid array package as claimed in claim 2, wherein said leadframe material is a metal.

5. A method for fabricating high density leaded ball-grid array package as claimed in claim 4, wherein said metal is copper.

6. A method for fabricating high density leaded ball-grid array package as claimed in claim 1, wherein said plastic material is a molding compound.

7. A method for fabricating high density leaded ball-grid array package as claimed in claim 1, wherein said solder mask is applied by a screen printing process.

8. A method for fabricating high density leaded ball-grid array package as claimed in claim 1, wherein said non-conductive layer is comprised of an epoxy material.

9. A method for fabricating high density leaded ball-grid array package as claimed in claim 1, wherein said non-conductive adhesive is comprised of an epoxy material.

10. A method for fabricating high density leaded ball-grid array package as claimed in claim 1, wherein said solder balls are comprised of eutectic solder bumps.

11. A method for fabricating high density leaded ball-grid array package as claimed in claim 10, wherein said solder bumps are comprised of 63% Sn and 37% Pb.

* * * * *